United States Patent
Li et al.

(10) Patent No.: US 12,167,585 B2
(45) Date of Patent: Dec. 10, 2024

(54) ARRAY STRUCTURE OF CAPACITORS, METHOD FOR MANUFACTURING ARRAY STRUCTURE OF CAPACITORS, AND DYNAMIC RANDOM ACCESS MEMORY

(71) Applicant: CHANGXIN MEMORY TECHNOLOGIES, INC., Hefei (CN)

(72) Inventors: Sen Li, Hefei (CN); Qiang Wan, Hefei (CN); Tao Liu, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 335 days.

(21) Appl. No.: 17/575,872

(22) Filed: Jan. 14, 2022

(65) Prior Publication Data

US 2022/0139919 A1    May 5, 2022

Related U.S. Application Data

(63) Continuation of application No. PCT/CN2021/104832, filed on Jul. 6, 2021.

(30) Foreign Application Priority Data

Sep. 16, 2020   (CN) .......................... 202010976168.1

(51) Int. Cl.
H10B 12/00    (2023.01)

(52) U.S. Cl.
CPC ........... *H10B 12/31* (2023.02); *H10B 12/033* (2023.02)

(58) Field of Classification Search
CPC ..... H10B 12/31; H10B 12/033; H10B 12/315
See application file for complete search history.

(56) References Cited

U.S. PATENT DOCUMENTS

| | | | | |
|---|---|---|---|---|
| 5,597,756 A | * | 1/1997 | Fazan | ................. H10B 12/318 438/398 |
| 6,013,550 A | * | 1/2000 | Lee | ...................... H10B 12/318 438/970 |
| 6,177,340 B1 | | 1/2001 | Yoo | |

(Continued)

FOREIGN PATENT DOCUMENTS

| CN | 1264178 A | 8/2000 |
|---|---|---|
| CN | 104037170 A | 9/2014 |

(Continued)

OTHER PUBLICATIONS

Supplementary European Search Report in the European application No. 21868227.6, mailed on Dec. 18, 2023. 7 pages.

(Continued)

*Primary Examiner* — Bitew A Dinke
(74) *Attorney, Agent, or Firm* — Syncoda LLC; Feng Ma

(57) ABSTRACT

An array structure of capacitors are provided. The array structure of capacitors includes a substrate and a first connection pad, a second connection pad, a first capacitive structure and a second capacitive structure that are disposed on the substrate. The first capacitive structure is disposed outside the second capacitive structure and adjacent to an edge of the substrate. The bottom surface of the first capacitive structure towards the substrate and the top surface of the first connection pad are disposed at intervals.

3 Claims, 16 Drawing Sheets

(56) References Cited

U.S. PATENT DOCUMENTS

| | | | | |
|---|---|---|---|---|
| 6,258,691 B1* | 7/2001 | Kim | ............... | H01L 28/82 |
| | | | | 257/E21.309 |
| 6,423,608 B1* | 7/2002 | Kim | ............... | H10B 12/0335 |
| | | | | 257/E27.088 |
| 6,501,119 B1* | 12/2002 | Ohno | ............... | H10B 12/0335 |
| | | | | 257/296 |
| 6,548,348 B1* | 4/2003 | Ni | ............... | H01L 28/87 |
| | | | | 257/E21.648 |
| 6,762,110 B1* | 7/2004 | Masuda | ............... | H01L 21/022 |
| | | | | 438/387 |
| 10,147,726 B1 | 12/2018 | Chang et al. | | |
| 10,354,803 B2 | 7/2019 | Komeda et al. | | |
| 10,373,957 B2 | 8/2019 | Chang | | |
| 2002/0113237 A1* | 8/2002 | Kitamura | ............... | H10B 12/0335 |
| | | | | 257/E21.018 |
| 2003/0038331 A1 | 2/2003 | Aoki | | |
| 2003/0214872 A1* | 11/2003 | Tu | ............... | H10B 12/485 |
| | | | | 257/E27.087 |
| 2006/0134855 A1 | 6/2006 | Choi | | |
| 2006/0255391 A1 | 11/2006 | Kim | | |
| 2007/0087558 A1* | 4/2007 | Hong | ............... | H01L 28/91 |
| | | | | 257/397 |
| 2009/0072291 A1* | 3/2009 | Takaishi | ............... | H10B 12/488 |
| | | | | 257/306 |
| 2010/0187588 A1* | 7/2010 | Kim | ............... | H10B 12/318 |
| | | | | 257/306 |
| 2010/0314710 A1 | 12/2010 | Yamaji | | |
| 2014/0252547 A1 | 9/2014 | Chen et al. | | |
| 2017/0077102 A1* | 3/2017 | Kim | ............... | H10B 12/315 |
| 2018/0337184 A1* | 11/2018 | Chang | ............... | H01L 23/535 |
| 2019/0148078 A1 | 5/2019 | Komeda et al. | | |
| 2022/0085024 A1* | 3/2022 | Li | ............... | H01L 28/90 |

FOREIGN PATENT DOCUMENTS

| | | | | |
|---|---|---|---|---|
| CN | 108962824 A | | 12/2018 | |
| CN | 110911424 A | | 3/2020 | |
| CN | 111063270 A | | 4/2020 | |
| CN | 211017076 U | * | 7/2020 | ............ H10B 12/03 |
| CN | 112864153 A | | 5/2021 | |
| JP | 2000174227 A | | 6/2000 | |

OTHER PUBLICATIONS

U.S. office action in U.S. Appl. No. 17/469,984, mailed on Jul. 18, 2024.

* cited by examiner

ARRAY STRUCTURE OF CAPACITORS, METHOD FOR MANUFACTURING ARRAY STRUCTURE OF CAPACITORS, AND DYNAMIC RANDOM ACCESS MEMORY

CROSS-REFERENCE TO RELATED APPLICATION

The application is a US continuation of International Application No. PCT/CN2021/104832, filed on Jul. 6, 2021, which claims priority to Chinese Patent Application No. 202010976168.1, filed to the China National Intellectual Property Administration on Sep. 16, 2020 and entitled "ARRAY STRUCTURE OF CAPACITORS, METHOD FOR MANUFACTURING ARRAY STRUCTURE CAPACITORS, AND DYNAMIC RANDOM ACCESS MEMORY". The disclosures of International Application No. PCT/CN2021/104832 and Chinese Patent Application No. 202010976168.1 are hereby incorporated by reference in their entireties.

BACKGROUND

The Dynamic Random Access Memory (DRAM) is a semiconductor memory for randomly writing in and reading data at high speed, and is widely applied to a data storage apparatus or device.

In the DRAM, a capacitive structure is required to be connected with a connection pad, thereby implementing a storage function. However, the capacitive structure located at an edge is unable to be connected with the connection pad due to process reasons, so that the capacitive structure is caused to be ineffective, and thus the performance of the DRAM is influenced.

SUMMARY

The present disclosure relates to the technical field of semiconductors, and in particular relates to an array structure of capacitors, a method for manufacturing the array structure of capacitors, and a Dynamic Random Access Memory.

A first aspect of the embodiments of the present disclosure provides an array structure of capacitors. The array structure of capacitors includes a substrate, a first connection pad, a second connection pad, a first capacitive structure and a second capacitive structure.

The first connection pad and the second connection pad are disposed on the substrate, each of the first connection pad and the second connection pad is provided with a bottom surface towards the substrate and a top surface away from the substrate, and both the bottom surface of the first connection pad and the bottom surface of the second connection pad are contacted with the substrate.

The first capacitive structure and the second capacitive structure connected with the second connection pad are disposed on the substrate.

The bottom of the first capacitive structure towards the substrate and the top surface of the first connection pad are disposed at intervals, a lower electrode layer of the first capacitive structure is provided with a first extension part extending towards the substrate, and a side surface of the first connection pad is coated by the first extension part.

A second aspect of the embodiments of the present disclosure provides a method for manufacturing an array structure of capacitors. The method includes the following operations.

A substrate is provided.

A first connection pad is formed on the substrate. The first connection pad is provided with a bottom surface towards the substrate and a top surface away from the substrate. The bottom surface of the first connection pad is contacted with the substrate.

A first capacitive structure is formed on the first connection pad. The lower electrode layer of the first capacitive structure is provided with a first extension part extending towards the substrate, and a side surface of the first connection pad is coated by the first extension part.

A third aspect of the embodiments of the present disclosure provides a DRAM. The DRAM includes an array structure of capacitors described above.

DETAILED DESCRIPTION

Figure 1:
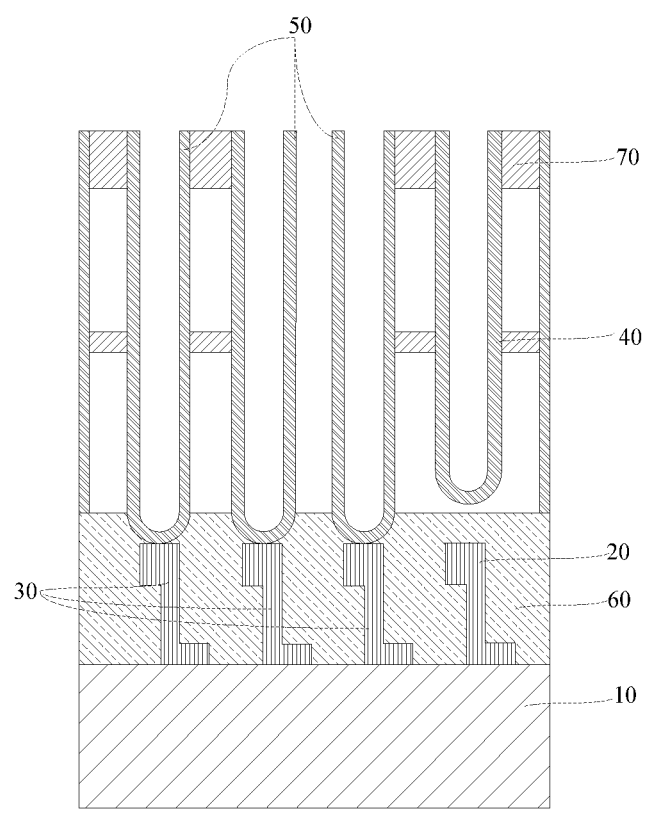
FIG. 1 is a schematic diagram of an array structure of capacitors in a related art.

For convenience of an understanding of the present application, the present application will now be described more fully hereinafter with reference to the related drawings. The preferred embodiments of the present application are shown in the accompanying drawings. The present application may, however, be embodied in many different forms which are not limited to the embodiments described herein. Rather, these embodiments are provided so that the disclosure of the present application will be thorough and comprehensive.

Unless defined otherwise, all technical and scientific terms used herein have the same meaning as commonly understood by those skilled in the art to which the present application belongs. The terms used herein in the specification of the present application are for the purpose of describing specific embodiments only and are not intended to be limiting of the present application.

The reference signs in the drawings are as follows: 10: substrate; 20: first connection pad; 21: first connection part; 22: second connection part; 23: transition part; 30: second connection pad; 40: first capacitive structure; 41: first extension part; 50: second capacitive structure; 51: second extension part; 60: dielectric structure; 70: supporting layer; 71: top supporting layer; 72: intermediate supporting layer; 80: first stacked layers structure; 81: first oxide layer; 82: first mask layer; 83: first silicon oxynitride layer; 90: annular groove; 91: filler layer; 100: second stacked layers structure; 101: electrode supporting layer; 1011: second oxide layer; 1012: silicon nitride layer; 1013: third oxide layer; 102: first sacrificial layer; 1021: polycrystalline silicon layer; 1022: fourth oxide layer; 1023: first carbon layer; 103: mask layer group; 1031: second silicon oxynitride layer; 1032: second mask layer; 110: capacitive hole; 120: opening; 130: opening region.

As used herein, the singular forms "a/an", "one", and "the" may include the plural forms as well, unless the context clearly dictates otherwise. It should also be understood that when the terms "compose" and/or "comprise" are used in the specification, the presence of the described features, integers, steps, operations, elements and/or components may be determined, but the presence or addition of one or more other features, integers, steps, operations, elements, components and/or groups is not excluded. At the same time, when used herein, the term "and/or" includes any and all combinations of related listed items.

Embodiments of the present disclosure provide an array structure of capacitors, a method for manufacturing the array structure of capacitors, and a DRAM which are used for solving a problem that a lower electrode layer of a first capacitive structure is contacted poorly with a first connection pad, preventing the first capacitive structure from being ineffective, and improving the performance of the DRAM.

According to the array structure of capacitors, the method for manufacturing the array structure of capacitors and the DRAM provided by the embodiments of the present disclosure, as the first extension part is formed on the lower electrode layer of the first capacitive structure adjacent to the edge of the substrate, and the first extension part extends towards the substrate and the side surface of the first connection pad is coated by the first extension part, the lower electrode layer of the first capacitive structure is electrically connected with the first connection pad, so that the first capacitive structure is prevented from being ineffective, and the performance of the DRAM is improved.

Besides the above described technical problems solved by the embodiments of the present disclosure, technical features constituting the technical solutions and beneficial effects of the technical features of these technical solutions, other technical problems solved by the array structure of capacitors, the method manufacturing for the array structure of capacitors and the DRAM provided by the embodiments of the present disclosure, other technical features included in the technical solutions and beneficial effects of these technical features will be further described in detail in specific embodiments.

In an actual working process, the inventor of the present disclosure finds that: as shown in FIG. 1, an array structure of capacitors may usually include a plurality of first capacitive structures 40 and a plurality of second capacitive structures 50, the first capacitive structures 40 are disposed outside the second capacitive structures 50, so that when the capacitive holes of the first capacitive structures 40 and the capacitive holes of the second capacitive structures 50 are etched, the top surfaces of the first connection pads 20 are difficultly exposed by the capacitive holes of the first capacitive structures 40 due to attenuation of etching energy, and thus the lower electrode layers of the first capacitive structures 40 are not contacted with the first connection pads 20 when the lower electrode layers of the first capacitive structures 40 are deposited subsequently, which results in that the first capacitive structures 40 cannot store data, and the performance of a DRAM is influenced.

For the above technical problems, according to the array structure of capacitors, a method for manufacturing the array structure of capacitors and the DRAM provided by the embodiments of the present disclosure, a first extension part is formed on the lower electrode layer of the first capacitive structure adjacent to the edge of a substrate, and the first extension part extends towards the substrate and a side surface of the first connection pad is coated by the first extension part, so that the lower electrode layer of the first capacitive structure is electrically connected with the first connection pad, thereby preventing the first capacitive structure from being ineffective, and improving the performance of the DRAM.

In order to make the above objectives, features and advantages of the embodiments of the present disclosure more obvious and understandable, the technical solutions in the embodiments of the present disclosure will be clearly and completely described below in combination with the drawings in the embodiments of the present disclosure. It is apparent that the described embodiments are not all embodiments but merely part of embodiments of the present disclosure. On the basis of the embodiments of the present disclosure, all other embodiments obtained by those of ordinary skilled in the art without creative work shall fall within the scope of protection of the present disclosure.

Figure 2:
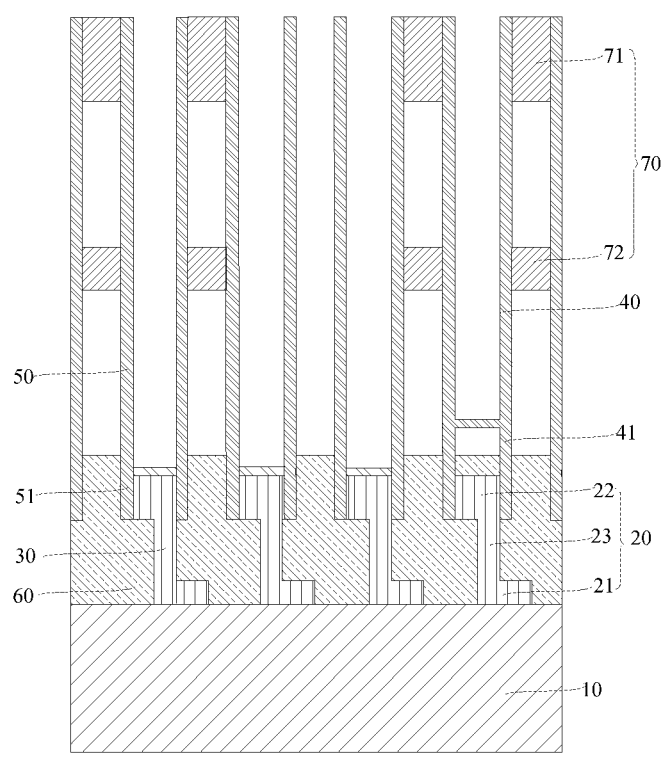
FIG. 2 is a first schematic structural diagram of an array structure of capacitors provided by the first embodiment of the present disclosure.
Figure 3:
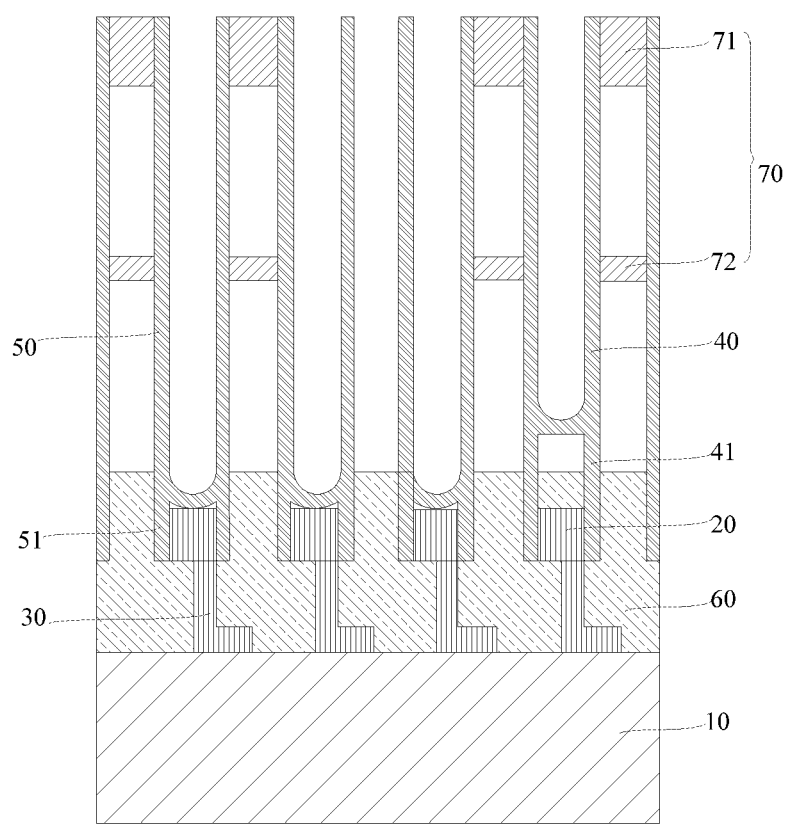
FIG. 3 is a second schematic structural diagram of an array structure of capacitors provided by the first embodiment of the present disclosure.

As shown in FIG. 2 and FIG. 3, the embodiments of the present disclosure provide an array structure of capacitors. The array structure of capacitors includes a substrate 10, and the substrate 10 is used as a supporting part of the array structure of capacitors and is configured to support other parts disposed thereon. The substrate 10 may be made of a semiconductor material, and the semiconductor material may be one or more of the following: silicon, germanium, a silicon germanium compound and a silicon carbon compound.

The first connection pad 20 and the second connection pad 30 are disposed on the substrate 10. Each of the first connection pad 20 and the second connection pad 30 is provided with a bottom surface towards the substrate 10 and a top surface away from the substrate 10. The bottom surface of the first connection pad 20 and the bottom surface of the second connection pad 30 are contacted with the substrate 10 to implement the electrical connection between the array structure of capacitors and the active region of the substrate 10, thereby implementing the signal transmission between the active region of the substrate 10 and the array structure of capacitors.

The first capacitive structure 40 and the second capacitive structure 50 connected with the second connection pad 30 are further disposed on the substrate 10. The first capacitive structure 40 is disposed outside the second capacitive structure 50 and is adjacent to an edge of the substrate 10. That is, taking orientation as shown in FIG. 2 as an example, the second capacitive structure 50 is disposed in a central region of the substrate 10, and the first capacitive structure 40 is disposed at an edge of the substrate 10. A signal in the active region of the substrate 10 is able to be transmitted to the second capacitive structure 50 through the second connection pad 30, thereby implementing the storage function of second capacitive structure 50.

It should be noted that the edge in the embodiments may be understood as an edge of the substrate, and may also be understood as a position on the substrate close to a logical control region.

The bottom surface of the first capacitive structure 40 towards the substrate 10 and the top surface of the first connection pad 20 are disposed at intervals, which results in that the bottom of the first capacitive structure 40 is not contacted with the first connection pad 20, and the signal in the active region of the substrate 10 is difficultly transmitted to the first capacitive structure 40 through the first connection pad 20, so that the storage function of first capacitive structure 40 is influenced, and thus the performance of the DRAM is influenced.

In the embodiment, the lower electrode layer of the first capacitive structure 40 is provided with a first extension part 41 extending towards the substrate 10. A side surface of the first connection pad 20 is coated by the first extension part 41 to enable an electrical connection between the lower electrode layer of the first capacitive structure 40 and the first connection pad 20 to be formed, thereby preventing the first capacitive structure 40 from being ineffective, and improving the performance of the DRAM.

It should be noted that the active region of the substrate 10 refers to a region used for disposing signal routing, which is used for being electrically connected with the array structure of capacitors and providing a control signal for the array structure of capacitors. In addition, there may be a plurality of active regions of the substrate 10, an isolation structure is disposed among the plurality of active regions, and the isolation structure is used to enable adjacent active regions to be insulated mutually.

In the embodiment, the contact between the bottom surface of the first connection pad 20 and the substrate 10 may be understood as direct contact or indirect contact. For example, necessary structures of the DRAM such as a transistor, a word line and a capacitor contact window (not shown in the figure) may be disposed in the substrate 10. One end of the capacitor contact window is electrically connected with the active region of the substrate 10, and the other end of the capacitor contact window is electrically connected with the bottom surface of the first connection pad 20. The electrical connection between the first capacitive structure 40 and the active region in the substrate 10 may be implemented by the arrangement of the capacitor contact window to enable the signal transmission to be convenient. Meanwhile, the second connection pad 30 may also be electrically connected with the active region of the substrate 10 through the capacitor contact window.

In some embodiments, the lower electrode layer of the second capacitive structure 50 is provided with a second extension part 51 extending towards the substrate 10. A top surface and a side surface of the second connection pad 30 are coated by the second extension part 51 on, so that the contact area between the lower electrode layer of the second capacitive structure 50 and the second connection pad 30 may be increased and contact resistance between the lower electrode layer of the second capacitive structure 50 and the second connection pad 30 may be reduced, thereby reducing the signal delay of the DRAM and improving the performance of the DRAM.

The first extension part 41 and the lower electrode layer of the first capacitive structure 40, the second extension part 51 and the lower electrode layer of the second capacitive structure 50 may be made of the same material and also made of different materials. In order to describe conveniently, description is performed by taking the first extension part 41 and the lower electrode layer of the first capacitive structure 40 as an example.

When the first extension part 41 and the lower electrode layer of the first capacitive structure 40 are made of the same material, the lower electrode layer of the first capacitive structure 40 may be ensured to have basically same resistance at various positions, signal delay of the DRAM is reduced, and the performance of the DRAM is improved. For example, the material of the first extension part 41 and the lower electrode layer of the first capacitive structure 40 may be one or more of the following: titanium nitride, tungsten, tungsten titanium, aluminum, copper or metal silicide.

The first extension part 41 and the lower electrode layer of the first capacitive structure 40 may be an integrated structure and may also be a split structure. When the first extension part 41 and the lower electrode layer of the first capacitive structure 40 are an integrated structure, the first extension part 41 and the lower electrode layer of the first capacitive structure 40 may be manufactured at the same time by adopting a same manufacturing process, so that the manufacturing process of the first extension part 41 and the lower electrode layer of the first capacitive structure 40 is simplified, and the production cost is reduced.

The shape of the first extension part 41 is adaptive to the shape of a joint of the first connection pad 20 and the first extension part 41. For example, the shape of the joint of the first connection pad 20 and the first extension part 41 is cylindrical, correspondingly, the shape of the first extension part 41 may be a circular structure, at least part of the first connection pad 20 extends into the circular structure, so that the side surface of the first connection pad 20 is attached to the inside surface of the circular structure. That is, the circular structure covers at least part of the side surface of the first connection pad 20.

Because the first connection pad 20 and the second connection pad 30 have similar functions both for implementing electrical connection between the first capacitive structure or the second capacitive structure and the capacitor contact window, the first connection pad and the second connection pad have similar structures. In order to describe conveniently, description in detail is performed by the embodiments below by taking the first connection pad as an example.

In some embodiments, the first connection pad 20 may include a first connection part 21, a second connection part 22 and a transition part 23. The transition part 23 is disposed between the first connection part 21 and the second connection part 22, one end of the transition part 23 is connected with the first connection part 21, and the other end of the transition part 23 is connected with the second connection part 22.

The first connection part 21 is electrically connected with the capacitor contact window, and the second connection part 22 is electrically connected with the lower electrode layer of the first capacitive structure 40. The electrical connection between the capacitor contact window and the lower electrode layer of the first capacitive structure 40 is implanted by the first connection pad 20 to enable the signal of the active region on the substrate 10 to be transmitted to the first capacitive structure 40, thereby implementing the storage function of the first capacitive structure 40.

For the first connection pad 20, a plane parallel to the substrate 10 is considered as a section, and the sectional area of the transition part 23 is less than the sectional area of the first connection part 21 and is less than the sectional area of the second connection part 22. In the embodiment, the transition part 23 is used for implementing connection between the first connection part 21 and the second connection part 22, and the transition part 23 does not make direct contact with the capacitor contact window or the lower electrode layer of the first capacitive structure 40. Therefore, the sectional area of the transition part 23 in the embodiment is relatively small, so that the area occupied by the first connection pad 20 may be reduced, and thus the size of the DRAM is reduced. Meanwhile, the sectional area of the first connection part 21 and the sectional area of the second connection part 22 are larger than the sectional area of transition part, and in a process of manufacturing the DRAM, the first connection pad 20 and the capacitor contact window may be aligned rapidly, and the first capacitive structure 40 and the first connection pad 20 may also be aligned rapidly, so that the manufacturing efficiency is increased.

Moreover, the sectional area of the first connection part 21 is larger than the sectional area of the transition part 23, the contact area between the first connection part 21 and the capacitor contact window may be increased, the contact resistance between the first connection part 21 and the capacitor contact window may be reduced, so that the signal delay between the first connection part 21 and the capacitor contact window is reduced, and the performance of the DRAM is improved. The sectional area of the second connection part 22 is larger than the sectional area of the transition part 23, the contact area between the second connection part 22 and the lower electrode layer of the first capacitive structure 40 may be increased, the contact resistance between the second connection part 22 and the lower electrode layer of the first capacitive structure 40 may be reduced, so that signal delay between the second connection part 22 and the lower electrode layer of the first capacitive structure 40 is reduced, and the performance of the DRAM is improved.

In the embodiment, a side surface of the second connection part 22 may be coated by the first extension part 41, so that the lower electrode layer of the first capacitive structure 40 is electrically connected with the first connection pad 20, thereby preventing the first capacitive structure from being ineffective, and improving the performance of the DRAM.

The operation that the side surface of the second connection part 22 may be coated by the first extension part 41 may be understood as: the first extension part 41 surrounds the second connection part 22, and the inside surface of the first extension part 41 is attached to the side surface of the second connection part 22.

The bottom surface of the first extension part 41 may be aligned to the bottom surface of the second connection part 22, at this time, the first extension part 41 covers all regions of the side surface of the second connection part 22. The first extension part 41 and the bottom surface of the second connection part 22 may also be separated by a predetermined distance, at this time, the first extension part 41 covers part of regions of the side surface of the second connection part 22.

In some embodiments, the array structure of capacitors may further include a dielectric structure 60. The dielectric structure 60 is disposed between the first capacitive structure 40 and the substrate 10. Meanwhile, the dielectric structure 60 is further disposed between the second capacitive structure 50 and the substrate 10, and the first connection pad 20 and the second connection pad 30 are disposed within the dielectric structure 60, so that the first connection pad 20 and the second connection pad 30 may be insulated with other parts, and normal operation of the DRAM is ensured. The other parts may be parts in the DRAM, besides the array structure of capacitors and the parts in the active region.

The dielectric structure 60 may include a single film layer and may also include a plurality of film layers which are stacked in sequence. When the dielectric structure 60 includes the plurality of film layers, materials of adjacent film layers may be same and may also be different. Exemplarily, the dielectric structure may include three film layers which are stacked in sequence, and materials of the three film layers may be silicon oxide, silicon nitride and silicon oxynitride.

In some embodiments, a plurality of first capacitive structures 40 and a plurality of second capacitive structures 50 may be disposed on the dielectric structure 60, the plurality of first capacitive structures 40 and the plurality of second capacitive structures 50 may be arranged in circumferential array. That is, the plurality of first capacitive structures 40 form a first circular structure in a surrounding manner, the plurality of second capacitive structures 50 form a second circular structure in a surrounding manner, and the first circular structure surrounds the second circular structure.

According to the embodiment, a supporting layer 70 is disposed between adjacent first capacitive structures 40, between adjacent second capacitive structures 50 and between the first capacitive structure 40 and the second capacitive structure 50 which are adjacent. On one hand, the plurality of first capacitive structures 40 and the plurality of second capacitive structures 50 may be separated by the supporting layer 70, so that the plurality of first capacitive structures 40 and the plurality of second capacitive structures 50 are conveniently controlled independently. On the other hand, the supporting layer 70 may also be configured to support the first capacitive structure 40 and the second capacitive structure 50, so that the structural strength of the array structure of capacitors is improved.

Each of the first capacitive structures 40 has a bottom towards the substrate and a top away from the substrate, and the supporting layer 70 may include a top supporting layer 71, an intermediate supporting layer 72 and a bottom supporting layer (not shown in the figure). The top supporting layer 71 is located among a plurality of capacitors, and the top surface of the top supporting layer 71 is aligned to the top of the capacitors. The bottom surface of the top supporting layer 71 and the dielectric structure 60 are disposed at intervals. The intermediate supporting layer 72 is located between the top supporting layer 71 and the dielectric structure 60. The bottom supporting layer is disposed in the dielectric structure 60. A three-point support mode is adopted in the embodiment, so that the strength of the array structure of capacitors may be ensured.

The Second Embodiment

Figure 4:
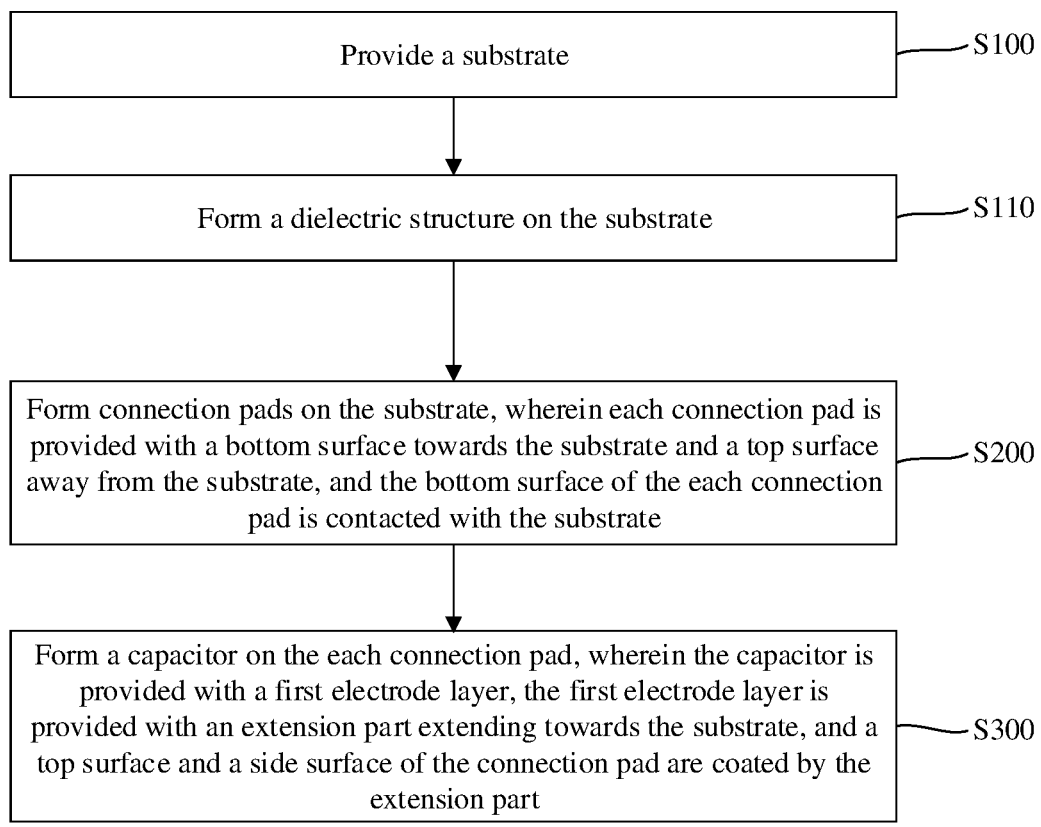
FIG. 4 is a first flowchart of a method for manufacturing an array structure of capacitors provided by the second embodiment of the present disclosure.

Referring to FIG. 4, the embodiments of the present disclosure further provide a method for manufacturing an array structure of capacitors, which includes the following steps.

At step S100, a substrate 10 is provided.

The substrate 10 is used as a supporting part of the array structure of capacitors and is configured to support other parts disposed thereon. The substrate 10 may be made of a semiconductor material. For example, the semiconductor material may be one or more of the following: silicon, germanium, a silicon germanium compound and a silicon carbon compound.

At step S200, a first connection pad 20 is formed on the substrate 10, the first connection pad 20 being provided with a bottom surface towards the substrate 10 and a top surface away from the substrate 10, and the bottom surface of the first connection pad 20 being contacted with the substrate 10.

The material of the first connection pad 20 may be one or more of the following: titanium nitride, tungsten, tungsten titanium, aluminum, copper or metal silicide, thereby implementing the electrical connection between an active region of the substrate 10 and the array structure of capacitors.

Exemplarily, before the step of forming the first connection pad 20 on the substrate 10, the method may further include the step S110.

Figure 5:
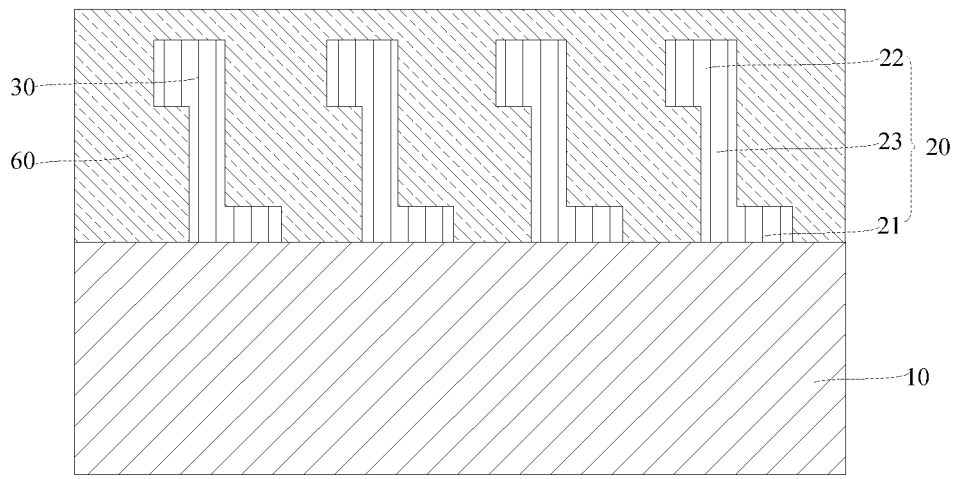
FIG. 5 is a schematic diagram of forming a dielectric structure and a connection pad of a method for manufacturing an array structure of capacitors provided by the second embodiment of the present disclosure.

As shown in FIG. 5, a dielectric structure 60 is formed on the substrate 10. Afterwards, the first connection pad 20 is formed in the dielectric structure 60. Through arrangement of the dielectric structure 60, mutual insulation among the first connection pad 20 and other parts on the substrate 10 besides the active region may be ensured.

In the step, a layer of dielectric structure 60 may be deposited on the substrate 10 through chemical deposition, physical deposition or an evaporation manner. Then, a connecting hole for containing the first connection pad 20 is formed on the dielectric structure 60 by adopting a patterning process. Finally, a conductive material is deposited in the connecting hole in a deposition manner, so that the first connection pad 20 is formed.

In the above step, the method may also include the step that a second connection pad 30 is formed on the substrate 10. That is, the second connection pad 30 may be formed in the dielectric structure 60 at the same time by adopting the above manufacturing manner. The second connection pad 30 is provided with a bottom surface towards the substrate 10 and a top surface away from the substrate. The bottom surface of the second connection pad 30 is contacted with the substrate 10. The electrical connection between a first capacitive structure 40 and an active region of the substrate 10 is implemented through the first connection pad 20. Meanwhile, the electrical connection between a second capacitive structure 50 and the active region of the substrate 10 is implemented through the second connection pad 30. The structures of the dielectric structure 60, the first connection pad 20 and the second connection pad 30 in the embodiments are as shown in FIG. 5.

At step S300, a first capacitive structure 40 is formed on the first connection pad 20, the lower electrode layer of the first capacitive structure 40 being provided with a first extension part 41 extending towards the substrate 10, and a side surface of the first connection pad 20 is coated by the first extension part 41.

Electrical connection between the first connection pad 20 and the first capacitive structure 40 is implemented by utilizing the first extension part 41, thereby preventing the first capacitive structure 40 from being ineffective, and improving the performance of the DRAM.

Meanwhile, a second capacitive structure 50 may further be formed on the second connection pad 30, the lower electrode layer of the second capacitive structure 50 being provided with a second extension part 51 extending towards the substrate 10, and a top surface and a side surface of the second connection pad 30 being coated by the second extension part 51.

The second extension part 51 may increase the contact area between the second connection pad 30 and the lower electrode layer of the second capacitive structure 50, reduce the contact resistance between the second connection pad 30 and the lower electrode layer of the second capacitive structure 50, reduce the signal delay of the DRAM, and improve the performance of the DRAM.

Figure 6:
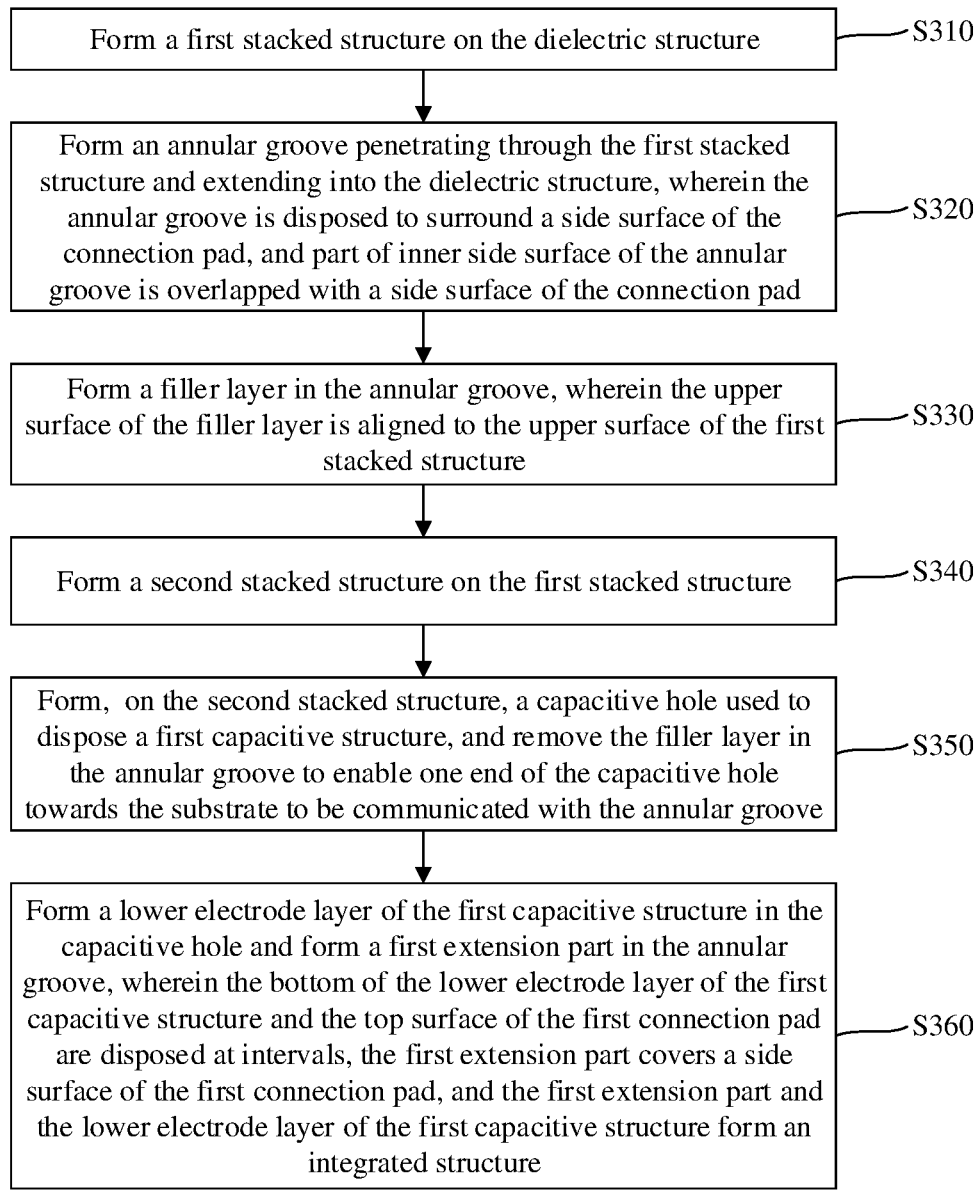
FIG. 6 is a second flowchart of a method for manufacturing an array structure of capacitors provided by the second embodiment of the present disclosure.

The first capacitive structure may be manufactured by adopting a manner shown in a process flowchart in FIG. 6 in S300. Exemplarily, the method includes the following steps.

At step S310, a first stacked structure 80 is formed on the dielectric structure 60.

Figure 7:
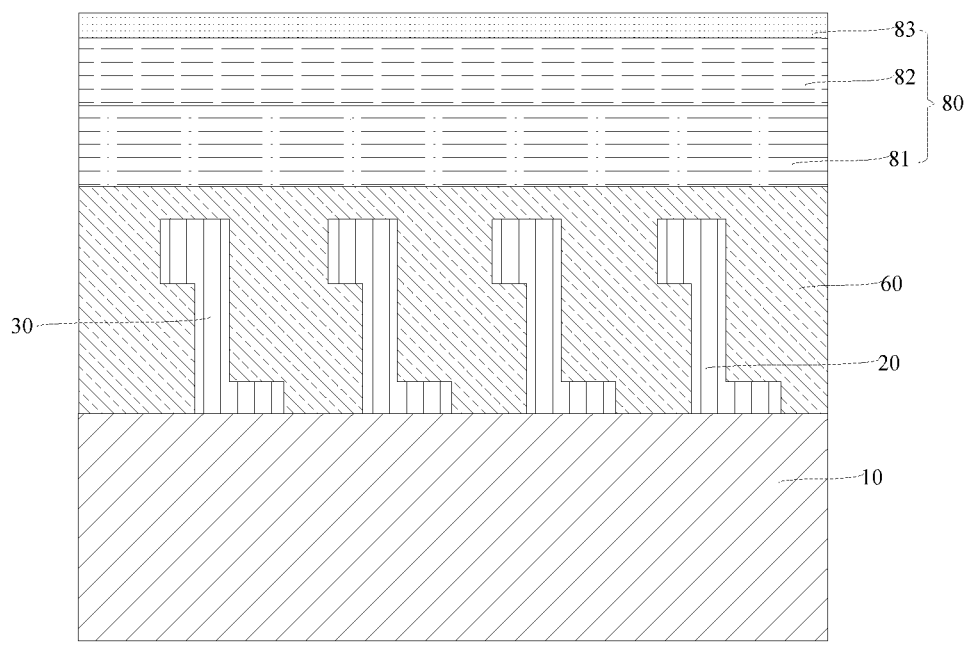
FIG. 7 is a schematic diagram of forming a first stacked structure of a method for manufacturing an array structure of capacitors provided by the second embodiment of the present disclosure.

In the step, the first stacked structure 80 may be formed on the dielectric structure 60 through an atomic layer deposition process or a chemical vapor deposition process. The first stacked structure 80 may include a first oxide layer 81, a first mask layer 82 and a first silicon oxynitride layer 83, thereby forming a structure as shown in FIG. 7. It should be noted that the first oxide layer 81 in the embodiment may be silicon oxide or zirconium oxide.

Figure 8:
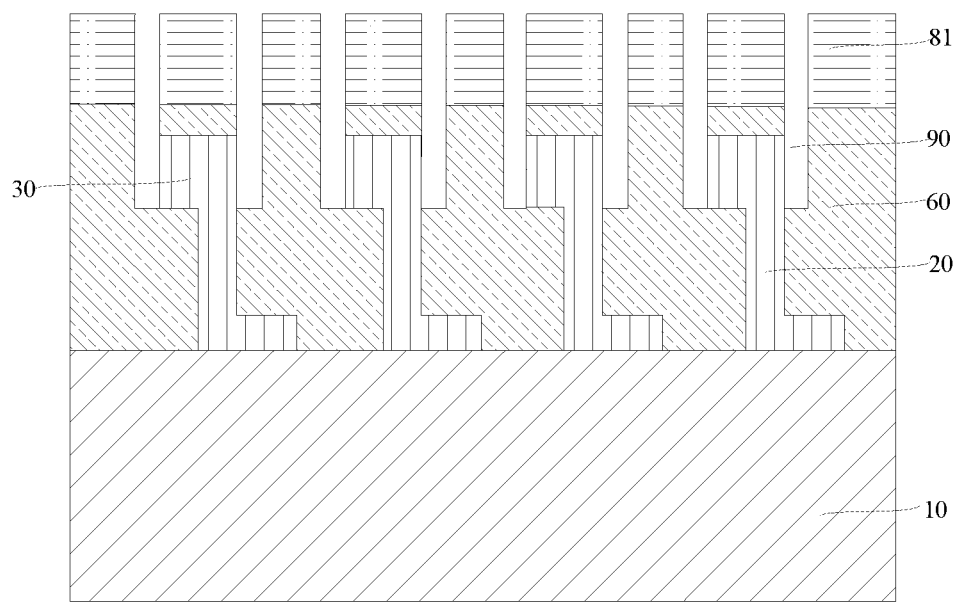
FIG. 8 is a schematic diagram of forming an annular groove of a method for manufacturing an array structure of capacitors provided by the second embodiment of the present disclosure.

At step S320, the annular groove 90 penetrating through the first stacked structure 80 and extending into the dielectric structure 60 is formed, the annular groove 90 is disposed to surround the side surface of the first connection pad 20, part of the inner side surface of the annular groove 90 is overlapped with the side surface of the first connection pad, thereby forming a structure as shown in FIG. 8. That is, the annular groove 90 is circular.

In the step, the operation may be performed by adopting the following process.

A plurality of first bulges disposed at intervals are formed on the first stacked structure 80, at least one of the first bulges corresponds to the first connection pad 20. In the horizontal direction, the width of the at least one of the first bulges is equal to the width of the first connection pad 20.

An etching layer is formed on the first stacked structure 80, and the etching ratio of the etching layer is greater than the etching ratio of the first stacked structure 80.

The first bulges and the etching layer are removed, and the annular groove 90 penetrating through the first stacked structure 80 and extending into the dielectric structure 60 is formed. The annular groove 90 is disposed to surround the side surface of the first connection pad 20, and part of the inner side surface of the annular groove 90 is overlapped with the side surface of the first connection pad 20. In the horizontal direction, the width of the annular groove 90 is equal to the width of the etching layer.

In the process, the process of forming the annular groove 90 is performed by adopting a Self-Aligned Double Patterning (SADP) process.

Figure 9:
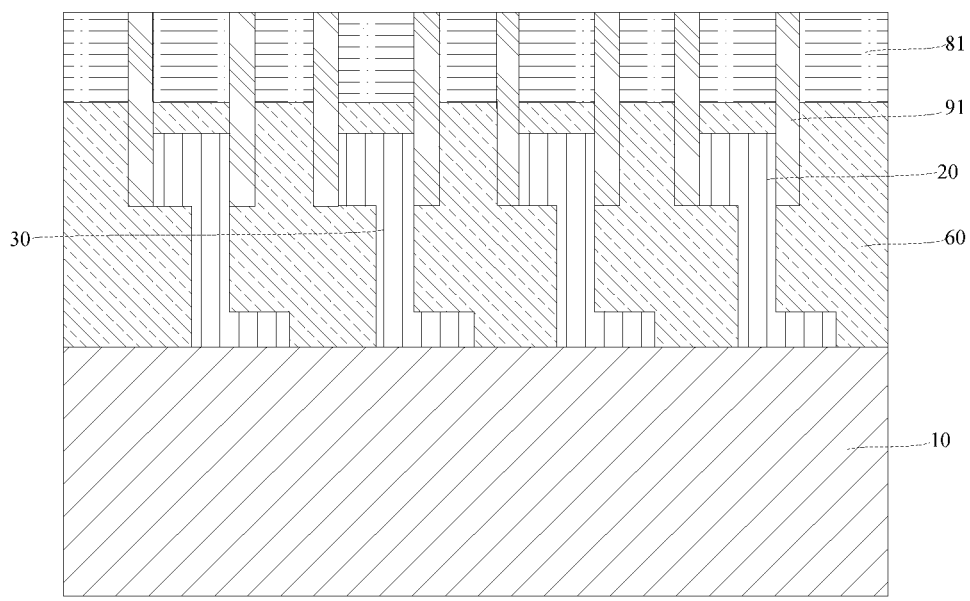
FIG. 9 is a schematic diagram of forming a filler layer of a method for manufacturing an array structure of capacitors provided by the second embodiment of the present disclosure.

At step S330, a filler layer 91 is formed in the annular groove 90, and the upper surface of the filler layer 91 is aligned to the upper surface of the first stacked structure. That is, the upper surface of the filler layer 91 is aligned to the upper surface of the first oxide layer 81, thereby forming a structure as shown in FIG. 9.

The filler layer 91 may be amorphous carbon, or, the filler layer 91 may be another medium layer, and the etching ratio of the medium layer is greater than the etching ratio of the dielectric structure 60.

At step S340, a second stacked structure 100 is formed on the first stacked structure 80.

In the step, the second stacked structure 100 may be formed on the first stacked structure 80 through an atomic layer deposition process or a chemical vapor deposition process. That is, the second stacked structure 100 is formed on the first oxide layer 81 through the atomic layer deposition process or the chemical vapor deposition process.

Figure 10:
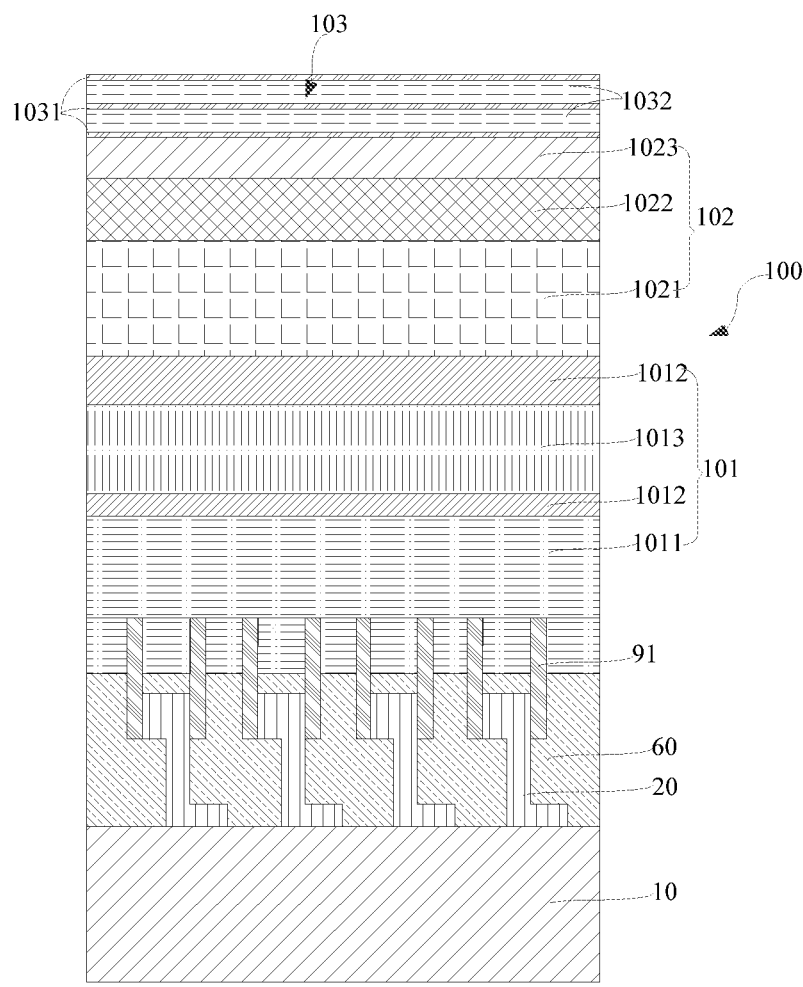
FIG. 10 is a schematic diagram of forming a second stacked structure of a method for manufacturing an array structure of capacitors provided by the second embodiment of the present disclosure.

As shown in FIG. 10, the second stacked structure 100 may include an electrode supporting layer 101, a first sacrificial layer 102 and a mask layer group 103 which are stacked in sequence, and the electrode supporting layer 101 is disposed on the first oxide layer 81.

The electrode supporting layer 101 may be a film layer composed of a single material, for example, the material of the electrode supporting layer 101 is silicon nitride. For another example, the electrode supporting layer 101 may be a plurality of film layers, and the materials of the various film layers are different. Exemplarily, the electrode supporting layer 101 may include a second oxide layer 1011, a silicon nitride layer 1012, a third oxide layer 1013 and a silicon nitride layer 1012 which are stacked on the first stacked structure in sequence. The second oxide layer 1011 and the third oxide layer 1013 each may include a silicon oxide layer.

The first sacrificial layer 102 may include a polycrystalline silicon layer 1021, a fourth oxide layer 1022 and a first carbon layer 1023, and the polycrystalline silicon layer 1021 is disposed on a side surface of the silicon nitride layer away from the third oxide layer 1013.

The mask layer group 103 includes a second silicon oxynitride layer 1031, a second mask layer 1032, a second silicon oxynitride layer 1031 and a second mask layer 1032 which are stacked in sequence.

In the embodiment, the etching ratio of the electrode supporting layer 101 is greater than the etching ratio of the first sacrificial layer 102, the etching ratio of the first sacrificial layer 102 is greater than the etching ratio of the mask layer group 103. Because the etching ratio of the electrode supporting layer 101 is the largest, at the same etching speed, the etching depth of the electrode supporting layer 101 is the largest, so that the concave grooves extending towards the substrate 10 will be formed on the electrode supporting layer 101 in a subsequent etching process.

Figure 11:
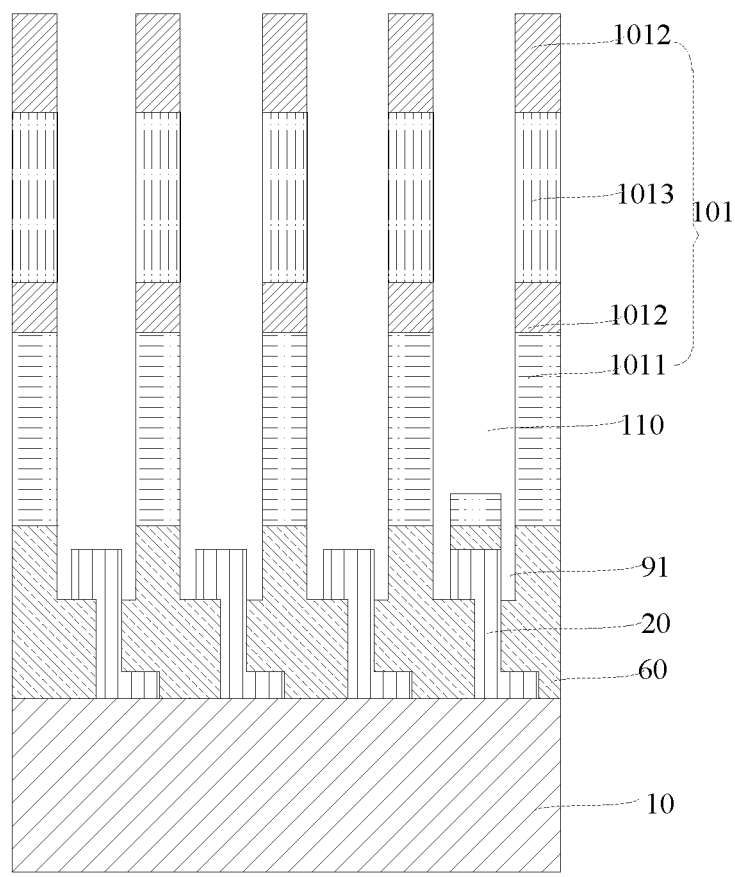
FIG. 11 is a schematic diagram of forming a capacitive hole of a method for manufacturing an array structure of capacitors provided by the second embodiment of the present disclosure.

At step S350, the capacitive hole 110 used to dispose the first capacitive structure 40 is formed in the second stacked structure 100, part of the capacitive holes penetrates through the second stacked structure 100 and extends to the top surface of the first connection pad 20, and the filler layer 91 in the annular groove 90 is removed, so that one end of the part of the capacitive hole towards the substrate 10 is communicated with the annular groove 90, the other part of the capacitive hole extends into the second stacked structure 100, so that the bottom surface of the part of the capacitive hole towards the substrate 10 and the first connection pad 20 are disposed at intervals, thereby forming a structure as shown in FIG. 11.

Figure 12:
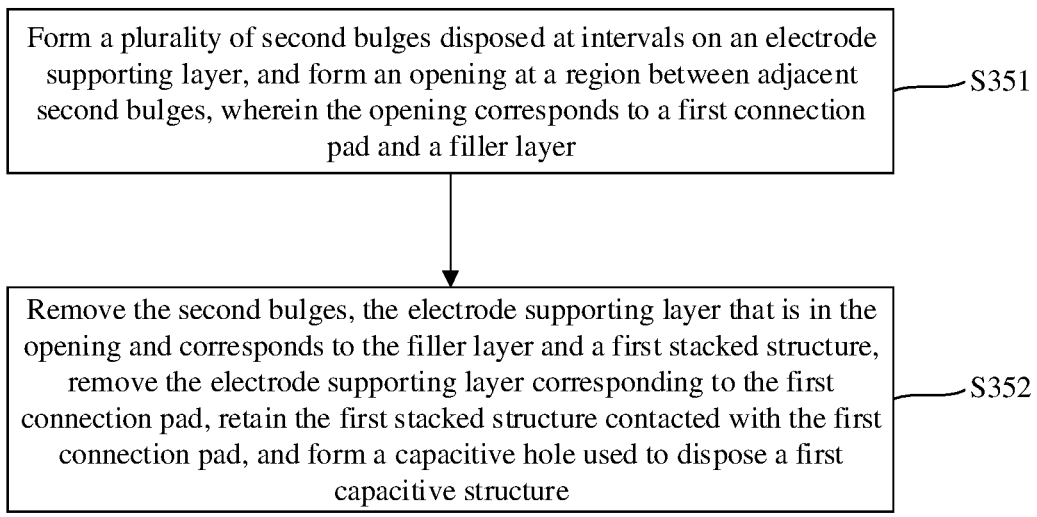
FIG. 12 is a third flowchart of a method for manufacturing an array structure of capacitors provided by the second embodiment of the present disclosure.

Exemplarily, as shown in FIG. 12, the step S350 may include the following steps.

At step S351, a plurality of second bulges disposed at intervals are formed on the electrode supporting layer 101, a region between adjacent second bulges forms an opening 120, and the opening corresponds to the first connection pad 20 and the filler layer 91.

Figure 13:
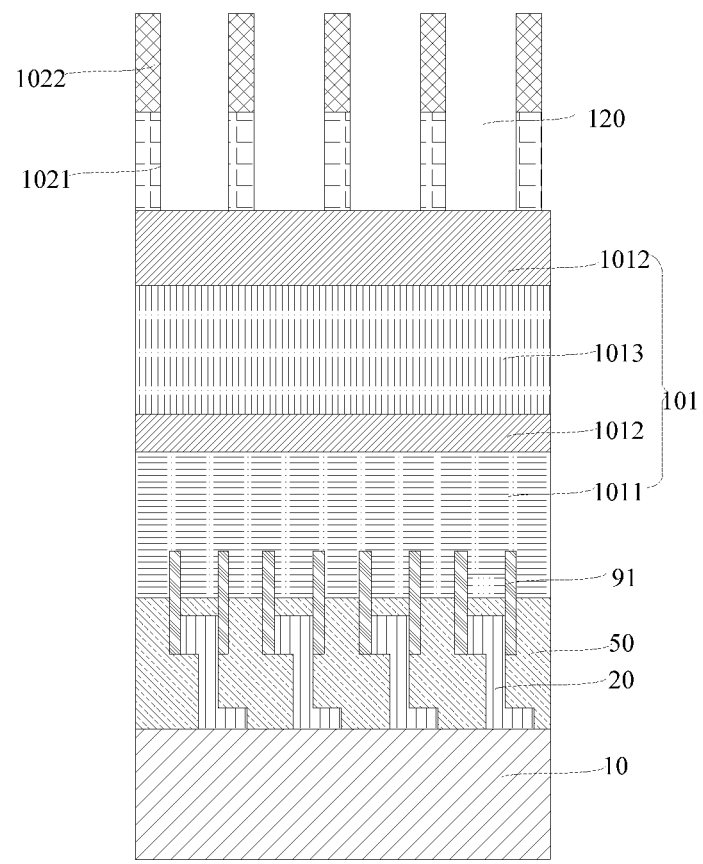
FIG. 13 is a schematic diagram of forming a second bulge of a method for manufacturing an array structure of capacitors provided by the second embodiment of the present disclosure.

In the step, because the etching ratio of the first sacrificial layer 102 is greater than the etching ratio of the mask layer group 103, at the same etching speed, the mask layer group 103 will be completely etched away, and a plurality of openings 120 are formed on the first sacrificial layer 102, the second bulge is formed between adjacent openings 120, and the opening 120 corresponds to the first connection pad 20 and the filler layer 91, thereby forming a structure as shown in FIG. 13.

At step S352, the second bulges, the electrode supporting layer 101 that is in the opening 120 and corresponds to the filler layer 91 and the first stacked structure are removed, the electrode supporting layer 101 corresponding to the first connection pad 20 is removed, the first stacked structure 80 making contact with the first connection pad 20 is retained, and the capacitive hole 110 configured to dispose the first capacitive structure 40 is formed, the structure of which is as shown in FIG. 11.

Figure 14:
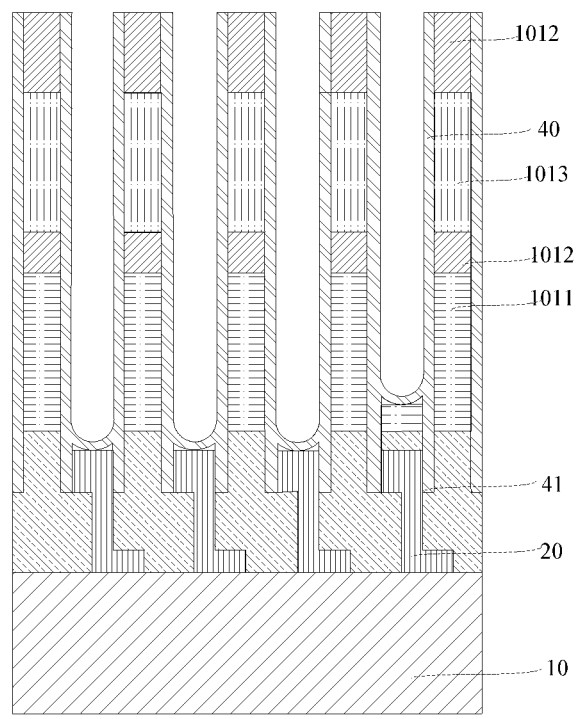
FIG. 14 is a schematic diagram of forming a first capacitive structure of a method for manufacturing an array structure of capacitors provided by the second embodiment of the present disclosure.

At step S360, the lower electrode layer of the first capacitive structure 40 is formed in the capacitive hole 110 and the first extension part 41 is formed in the annular groove 90, the bottom of the lower electrode layer of the first capacitive structure 40 and the top surface of the first connection pad 20 are disposed at intervals, the first extension part 41 covers the side surface of the first connection pad 20 and forms an integrated structure with the lower electrode layer of the first capacitive structure 40, thereby forming a structure as shown in FIG. 14.

The material of the lower electrode layer of the first capacitive structure 40 is deposited on the side wall of the capacitive hole 110, in the annular groove 90 and on the first stacked structure 80 corresponding to the first connection pad 20 by adopting the atomic layer deposition process, and the lower electrode layer of the first capacitive structure 40 and the first extension part 41, which are of an integrated structure, are formed on the side wall of the capacitive hole 110, in the annular groove 90 and on the first stacked structure 80 corresponding to the first connection pad 20. The first extension part 41 covers the side surface of the first connection pad 20, so that the lower electrode layer of the first capacitive structure 40 and the first connection pad 20 are electrically connected, the first capacitive structure 40 is prevented from being ineffective, and the performance of the DRAM is improved.

Moreover, the material of the lower electrode layer of the first capacitive structure 40 and the first extension part 41 may be one or a compound formed by metal nitride and metal silicide, such as titanium nitride, titanium silicide or titanium silicon nitride.

Figure 15:
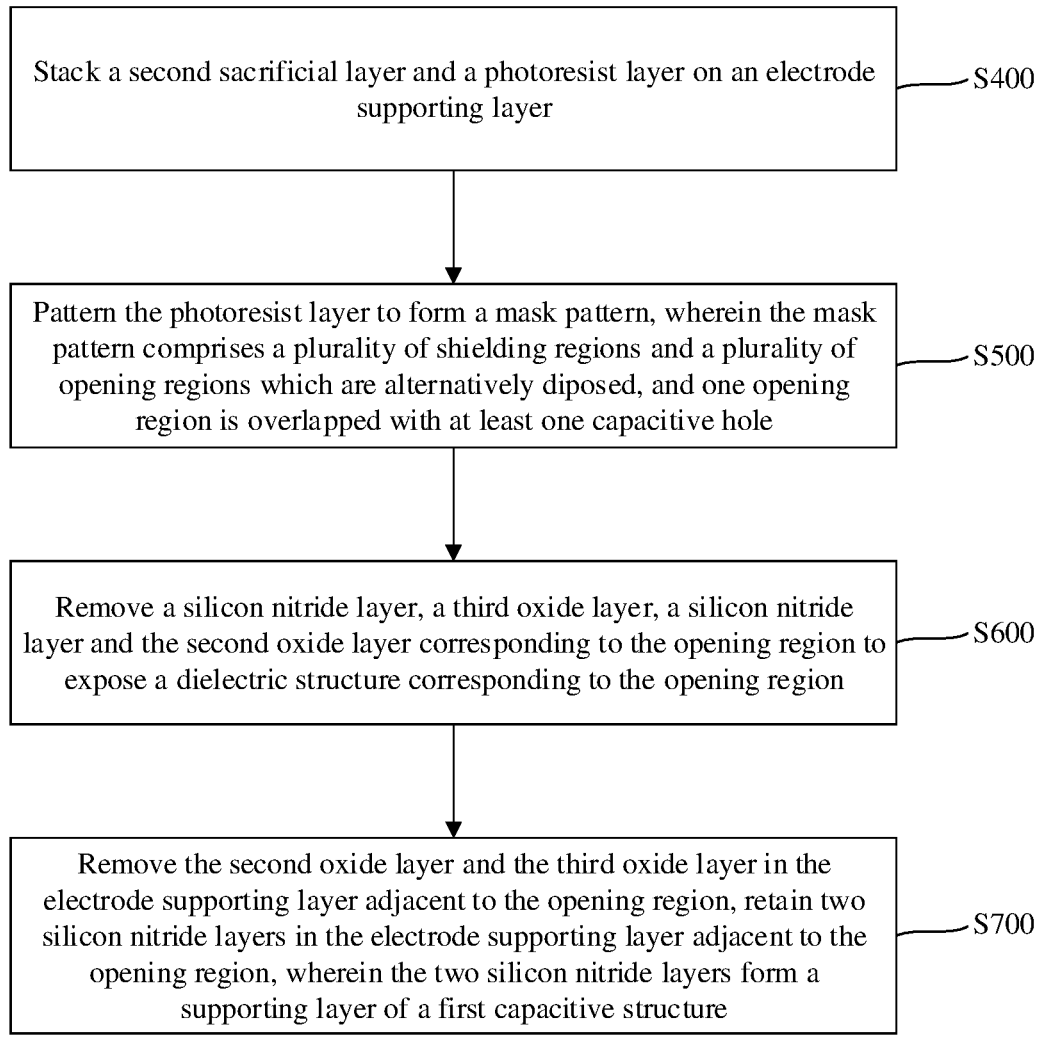
FIG. 15 is a fourth flowchart of a method for manufacturing an array structure of capacitors provided by the second embodiment of the present disclosure.

After the steps of forming the lower electrode layer of the first capacitive structure 40 in the capacitive hole 110 and forming the first extension part 41 in the annular groove 90, the method further includes the following steps, as shown in FIG. 15.

At step S400, a second sacrificial layer and a photoresist layer are stacked on the electrode supporting layer 101.

In the step, the second sacrificial layer may be a single oxide film layer, and may also be a second carbon layer and a silicon oxynitride which are stacked.

At step S500, the photoresist layer is patterned to form a mask pattern, the mask pattern includes a plurality of shielding regions and a plurality of opening regions 130 which are disposed alternatively, and one opening region 130 is overlapped with at least one capacitive hole 110.

Figure 16:
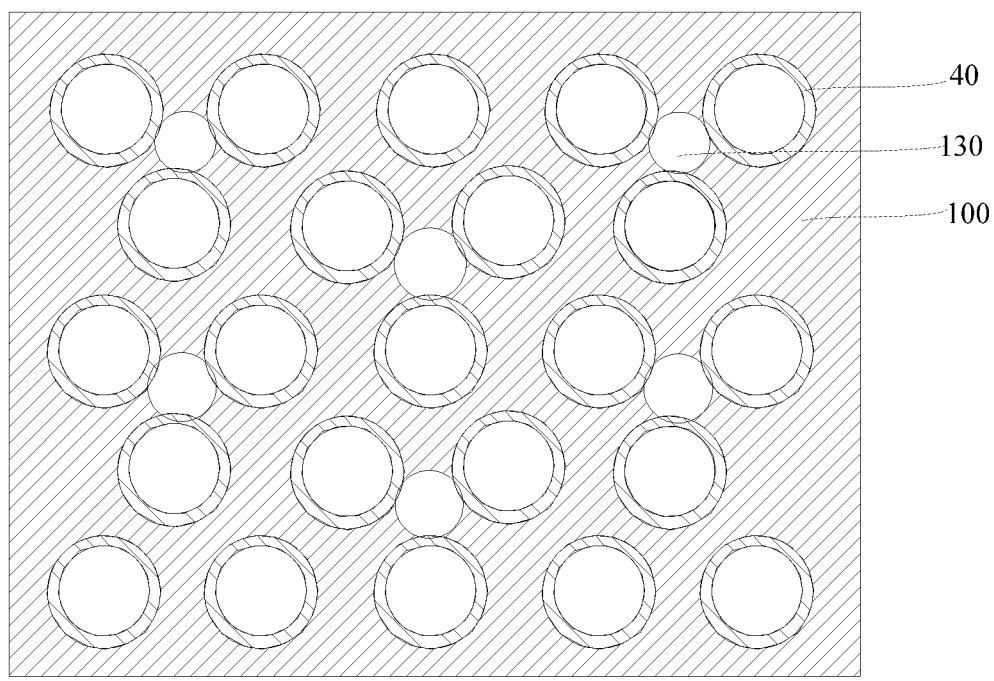
FIG. 16 is a schematic diagram of forming an opening region of a method for manufacturing an array structure of capacitors provided by the second embodiment of the present disclosure.

The opening region is overlapped with a plurality of capacitive holes. For example, as shown in FIG. 16, the array structure of capacitors provided by the embodiments includes a plurality of capacitive holes, every three capacitive holes form a triangular capacitive hole group, a plurality of capacitive hole groups are distributed on the dielectric structure at intervals, and the center of the opening region 130 is overlapped with the center of the triangular capacitive hole group.

At step S600, the silicon nitride layer 1012, the third oxide layer 1013, the silicon nitride layer 1012 and the second oxide layer 1011 corresponding to the opening region 130 are removed to expose the dielectric structure 60 corresponding to the opening region 130.

In the step, under other conditions, part of upper electrode layer of the first capacitive structure corresponding to the opening region 130 may also be removed.

At step S700, the second oxide layer and the third oxide layer in the electrode supporting layer 101 adjacent to the opening region 130 are removed, two silicon nitride layers 1012 in the electrode supporting layer 101 adjacent to the opening region 130 are retained, and the two silicon nitride layers 1012 form the supporting layer 70 of the first capacitive structure 40, thereby forming structures as shown in FIG. 2 and FIG. 3.

According to the method for manufacturing the array structure of capacitors provided by the embodiments of the present disclosure, as the first extension part is formed on the lower electrode layer of the first capacitive structure adjacent to the edge of the substrate, and the first extension part extends towards the substrate and the side surface of the first connection pad is coated by the first extension part, the lower electrode layer of the first capacitive structure is electrically connected with the first connection pad, so that the first capacitive structure is prevented from being ineffective, and the performance of the DRAM is improved.

The Third Embodiment

The embodiments of the present disclosure further provide a DRAM. The DRAM includes an array structure of capacitors described in the above embodiments. Because of including the array structure of capacitors described in the above embodiments, the DRAM also has the same advantages with the array structure of capacitors, which refers to relevant description for details and will not be elaborated herein.

Various embodiments or implementation modes in the specification are described in a progressive way, each of the embodiments focuses on the differences from other embodiments, and same and similar parts among various embodiments may be referred to each other.

In descriptions of the specification, description of referring terms such as "one embodiment", "some embodiments", "a schematic embodiment", "a example", "a specific example", or "some examples" refers to specific features, structures, materials or features involved in at least one embodiment or example of the present disclosure described in combination with the embodiments or examples. In the specification, schematic description on the above terms not always refers to same embodiment or example. Moreover, the described specific features, structures, materials or features may be combined in any one or more embodiments or examples in a proper manner.

Finally, it should be noted that the above various embodiments are only used to illustrate the technical solutions of the present disclosure, and are not limited thereto. Although the present disclosure has been described in detail with reference to the foregoing various embodiments, those skilled in the art should understand that the technical solutions described in the foregoing various embodiments still may be modified, or part or all technical features are equivalently replaced, but the modifications and replacements do not make the essence of the corresponding technical solutions depart from the scope of the technical solutions of various embodiments of the present disclosure.

The invention claimed is:

1. A method for manufacturing an array structure of capacitors, comprising:
providing a substrate;
forming a first connection pad and a second connection pad on the substrate, wherein the first connection pad and the second connection pad are provided with a bottom surface towards the substrate and a top surface away from the substrate, and both the bottom surface of the first connection pad and the bottom surface of the second connection pad are contacted with the substrate;
forming a first capacitive structure and a second capacitive structure connected with the second connection pad that are disposed on the substrate, wherein a lower electrode layer of the first capacitive structure is provided with a first extension part extending towards the substrate, and a side surface of the first connection pad is coated by the first extension part; and
forming a dielectric structure on the substrate,
wherein forming the first capacitive structure comprises:
forming a first stacked structure on the dielectric structure;
forming an annular groove penetrating through the first stacked structure and extending into the dielectric structure, wherein the annular groove is disposed to surround the side surface of the first connection pad, and part of an inner side surface of the annular groove is overlapped with the side surface of the first connection pad;
forming a filler layer in the annular groove, wherein an upper surface of the filler layer is aligned to an upper surface of the first stacked structure;
forming a second stacked structure on the first stacked structure;
forming, on the second stacked structure, a capacitive hole used to dispose the first capacitive structure, and removing the filler layer in the annular groove to enable one end of the capacitive hole towards the substrate to be in communication with the annular groove; and
forming the lower electrode layer of the first capacitive structure in the capacitive hole and forming the first extension part in the annular groove, wherein a bottom of the lower electrode layer of the first capacitive structure and the top surface of the first connection pad are disposed at intervals, the first extension part covers the side surface of the first connection pad and the first extension part forms an integrated structure with the lower electrode layer of the first capacitive structure.

2. The method for manufacturing the array structure of capacitors of claim 1,
wherein a lower electrode layer of the second capacitive structure is provided with a second extension part extending towards the substrate, and the top surface and a side surface of the second connection pad are coated by the second extension part.

3. The method for manufacturing the array structure of capacitors of claim 1, wherein forming the annular groove penetrating through the first stacked structure and extending into the dielectric structure comprises:
forming, on the first stacked structure, a plurality of first bulges disposed at intervals, wherein at least one of the first bulges corresponds to the first connection pad, and in a horizontal direction, a width of the at least one of the first bulges is equal to a width of the first connection pad;
forming an etching layer on the first stacked structure, wherein an etching ratio of the etching layer is greater than an etching ratio of the first stacked structure; and
removing the first bulges and the etching layer to form the annular groove penetrating through the first stacked structure and extending into the dielectric structure, wherein the annular groove is disposed to surround the side surface of the first connection pad, the part of the inner side surface of the annular groove is overlapped with the side surface of the first connection pad, and in the horizontal direction, a width of the annular groove is equal to a width of the etching layer.

* * * * *